(12) United States Patent
Ranjan et al.

(10) Patent No.: US 10,373,828 B2
(45) Date of Patent: Aug. 6, 2019

(54) METHOD OF SIDEWALL IMAGE TRANSFER (71) Applicant: Tokyo Electron Limited, Minato-ku, Tokyo (JP)

(72) Inventors: Alok Ranjan, Tomiya (JP); Sonam D. Sherpa, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/607,406

(22) Filed: May 26, 2017

(65) Prior Publication Data

US 2017/0345671 A1 Nov. 30, 2017

Related U.S. Application Data

(60) Provisional application No. 62/342,993, filed on May 29, 2016.

(51) Int. Cl.
*H01L 21/3065* (2006.01)
*H01L 21/033* (2006.01)
(Continued)

(52) U.S. Cl.
CPC .... *H01L 21/0337* (2013.01); *H01L 21/02238* (2013.01); *H01L 21/02381* (2013.01);
(Continued)

(58) Field of Classification Search
None
See application file for complete search history.

(56) References Cited

U.S. PATENT DOCUMENTS 7,977,249 B1 7/2011 Liu et al.
9,484,202 B1 * 11/2016 Zhou .................... H01L 21/311
(Continued)

FOREIGN PATENT DOCUMENTS

KR 1020110084419 A 7/2011
WO 2013047464 A1 4/2013

OTHER PUBLICATIONS

Korean Intellectual Property Office, International Search Report and Written Opinion for International application No. PCT/US2017/034868, dated Jul. 31, 2017, 11 pages.
(Continued)

*Primary Examiner* — Stephanie P Duclair (57) ABSTRACT

According to one embodiment, a substrate processing method includes providing a substrate containing Si raised features, depositing a conformal film on the Si raised features, and performing a spacer etch process that removes horizontal portions of the conformal film while substantially leaving vertical portions of the conformal film to form sidewall spacers on the Si raised features, the performing including a) exposing the substrate to a plasma-excited first process gas consisting of $H_2$ gas and optionally an inert gas, and b) exposing the substrate to a plasma-excited second process gas containing i) $NF_3$, $O_2$, $H_2$, and Ar, ii) $NF_3$, $O_2$, and $H_2$, iii) $NF_3$ and $O_2$, iv) $NF_3$, $O_2$, and Ar, v) $NF_3$ and $H_2$, or vi) $NF_3$, $H_2$, and Ar. The method further includes removing the Si raised features while maintaining the sidewall spacers on the substrate. The removing may be performed using steps a) and b).

20 Claims, 4 Drawing Sheets

(51) Int. Cl.
*H01L 21/02* (2006.01)
*H01L 21/3213* (2006.01)
*H01L 21/311* (2006.01)

(52) U.S. Cl.
CPC .... *H01L 21/3065* (2013.01); *H01L 21/31116* (2013.01); *H01L 21/32136* (2013.01); *H01L 21/32137* (2013.01); H01L 21/0217 (2013.01); H01L 21/0228 (2013.01); H01L 21/02274 (2013.01)

(56) References Cited

U.S. PATENT DOCUMENTS

| | | | |
|---|---|---|---|
| 2009/0286402 | A1 | 11/2009 | Xia et al. |
| 2010/0267237 | A1* | 10/2010 | Bonser ............... H01L 21/3086 438/689 |
| 2012/0238102 | A1* | 9/2012 | Zhang ............... H01J 37/32422 438/718 |
| 2014/0273292 | A1 | 9/2014 | Posseme et al. |
| 2015/0287612 | A1 | 10/2015 | Luere et al. |
| 2015/0371865 | A1 | 12/2015 | Chen et al. |
| 2016/0027655 | A1 | 1/2016 | Chen et al. |

OTHER PUBLICATIONS

Taiwanese IPO, Notification of Examination Opinions for Taiwanese Patent Application No. 106117833, dated Apr. 16, 2018, 16pages.
Taiwanese IPO, Notice of Rejection Decision for Taiwanese Patent Application No. 106117833, dated Nov. 9, 2018, 10pages.

* cited by examiner

METHOD OF SIDEWALL IMAGE TRANSFER

CROSS-REFERENCE TO RELATED APPLICATIONS

This application is related to and claims priority to U.S. Provisional Patent Application Ser. No. 62/342,993 filed on May 29, 2016, the entire contents of which are herein incorporated by reference.

FIELD OF THE INVENTION

This invention relates to methods for processing a substrate, and more particularly to methods for sidewall image transfer that includes sidewall spacers on silicon raised features.

BACKGROUND OF THE INVENTION

Sidewall image transfer (SIT) is an indirect patterning method that involves the etching of a silicon nitride spacer and a silicon mandrel to achieve sub-lithographic linewidths. Current approaches to etching of a silicon nitride spacer face two main challenges, footing and corner rounding. Current methods used to extract the silicon mandrel involve the redeposition of etch by-products and bombardment by energetic ions. However, these processes result in corner residue and significant damage to the underlying material. New methods are needed that solve these and other problems in sidewall image transfer.

SUMMARY OF THE INVENTION

Methods for sidewall image transfer are described that include sidewall spacers on silicon raised features. According to one embodiment, the method includes providing a substrate containing silicon (Si) raised features, depositing a conformal film on the Si raised features, performing a spacer etch process that removes horizontal portions of the conformal film while substantially leaving vertical portions of the conformal film to form sidewall spacers on the Si raised features, the performing including a) exposing the substrate to a plasma-excited first process gas consisting of $H_2$ gas and optionally an inert gas, and b) exposing the substrate to a plasma-excited second process gas containing i) $NF_3$, $O_2$, $H_2$, and Ar, ii) $NF_3$, $O_2$, and $H_2$, iii) $NF_3$ and $O_2$, iv) $NF_3$, $O_2$, and Ar, v) $NF_3$ and $H_2$, or vi) $NF_3$, $H_2$, and Ar. The method further includes removing the Si raised features while maintaining the sidewall spacers on the substrate, the removing including c) exposing the substrate to a plasma-excited third process gas consisting of $H_2$ gas and optionally an inert gas, and d) exposing the substrate to a plasma-excited fourth process gas containing i) $NF_3$, $O_2$, $H_2$, and Ar, ii) $NF_3$, $O_2$, and $H_2$, iii) $NF_3$ and $O_2$, iv) $NF_3$, $O_2$, and Ar, v) $NF_3$ and $H_2$, or vi) $NF_3$, $H_2$, and Ar.

According to another embodiment, the method includes providing a substrate containing SiN sidewall spacers on Si raised features, and removing the Si raised features while maintaining the SiN sidewall spacers on the substrate, the removing including exposing the substrate to a first plasma-excited process gas consisting of $H_2$ gas and optionally an inert gas, and exposing the substrate to a second plasma-excited process gas containing i) $NF_3$, $O_2$, $H_2$, and Ar, ii) $NF_3$, $O_2$, and $H_2$, iii) $NF_3$ and $O_2$, iv) $NF_3$, $O_2$, and Ar, v) $NF_3$ and $H_2$, or vi) $NF_3$, $H_2$, and Ar. In one example, the first process gas consists of $H_2$ and Ar, and the second process gas consists of $NF_3$, $O_2$, $H_2$, and Ar.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF SEVERAL EMBODIMENTS

Embodiments of the invention provide a method for sidewall image transfer. The inventive sidewall image transfer uses non-polymerizing chemistry that can be anisotropic and yet avoids the adverse impact of ion bombardment, which is required for the etching of a silicon nitride spacer. According to one embodiment, isotropic etching of silicon with very high selectivity to the silicon nitride spacer and an underlying oxide (e.g., $SiO_2$) is provided for mandrel pull. Embodiments of the invention describe a multi-step dry processing method that may be performed in a single processing chamber. This is advantageous over many conventional methods that use a combination of dry and wet processing methods that require multiple processing chambers and can be incompatible with advanced device manufacturing.

As used herein, the notation "SiN" includes layers that contain silicon and nitrogen as the major constituents, where the layers can have a range of Si and N compositions. $Si_3N_4$ is the most thermodynamically stable of the silicon nitrides and hence the most commercially important of the silicon nitrides. However, embodiments of the invention may be applied to SiN layers having a wide range of Si and N compositions. Furthermore, the notation "$SiO_2$" is meant to include layers that contain silicon and oxygen as the major constituents, where the layers can have a range of Si and O compositions. $SiO_2$ is the most thermodynamically stable of the silicon oxides and hence the most commercially important of the silicon oxides.

One embodiment of the invention provides a process for a) etching a SiN spacer layer to form a SiN sidewall spacer layer without corner rounding and footing, and subsequent b) extraction of a Si mandrel without corner residue and damage to underlying material. Processes a) and b) may use the same or similar processing steps and may be carried out in a single processing chamber.

Figure 1A:
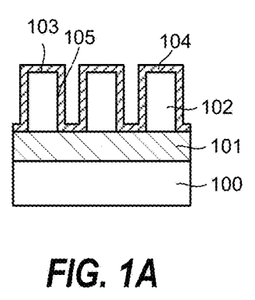
FIGS. 1A-1C schematically show through cross-sectional views a method of processing a substrate.
Figure 1B:
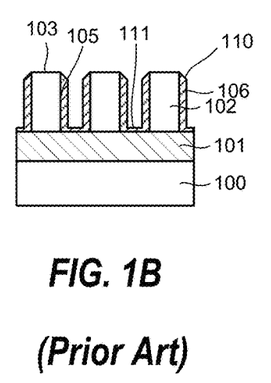
Figure 1C:
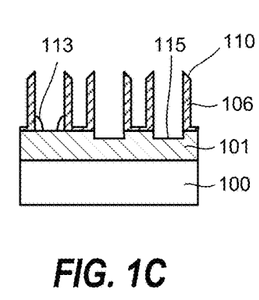

FIGS. 1A-1C schematically show through cross-sectional views a method of processing a substrate. FIG. 1A shows a substrate 100, a $SiO_2$ layer 101, Si raised features 102, and a SiN spacer layer 104 conformally formed on horizontal portions 103 and vertical portions 105 of the Si raised features 102. FIG. 1B shows SiN sidewall spacers 106 that may be formed on vertical portions 105 of the Si raised features 102 by preferentially etching the SiN spacer layer 104 on the horizontal portions 103 in an anisotropic etch process that may include a fluorocarbon-containing plasma. The fluorocarbon-containing etch process has drawbacks that include a tapered profile 110 of the SiN sidewall spacers 106 due to corner rounding and a footing 111 due to incomplete removal of the SiN spacer layer 104 on the $SiO_2$ layer 101.

The Si raised features 102 are often referred to as mandrels and they may be removed using a halogen-containing etch process (i.e., a mandrel pull process). FIG. 1C illustrates several disadvantages of a halogen-containing etch process for removing the Si raised features 102, including a recess 115 in the $SiO_2$ layer 101 due to poor etch selectivity between Si and $SiO_2$, the presence of (polymer) corner residue 113, and spacer erosion that produces the tapered profile 110 at the top of the SiN sidewall spacers 106. Embodiments of the invention address these disadvantages of the fluorocarbon-containing etch process and the halogen-containing etch process.

Figure 2A:
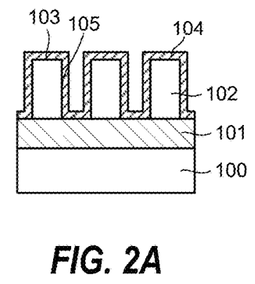
FIGS. 2A-2C schematically show through cross-sectional views a method of processing a substrate according to an embodiment of the invention.
Figure 2B:
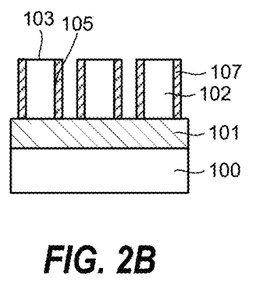
Figure 2C:
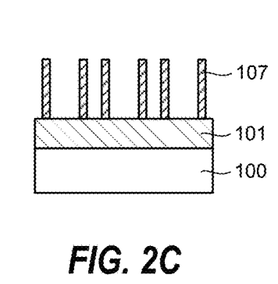

FIGS. 2A-2C schematically show through cross-sectional views a method of processing a substrate according to an embodiment of the invention. FIG. 1A has been reproduced as FIG. 2A and shows a substrate 100, a $SiO_2$ layer 101, Si raised features 102, and a SiN spacer layer 104 conformally formed on horizontal portions 103 and vertical portions 105 of the Si raised features 102. The Si raised features 102 can contain polycrystalline Si (poly-Si) or amorphous Si (a-Si).

FIG. 2B shows a structure following a spacer etch that forms SiN sidewall spacers 107 on the vertical portions 105 by preferentially etching the SiN spacer layer 104 on the horizontal portions 103. According to an embodiment of the invention, the spacer etch includes a two-step etch process containing a) plasma-exciting a first process gas containing $H_2$ and optionally Ar gas, and exposing the structure in FIG. 2A to the plasma-excited first process gas, and b) plasma-exciting a second process gas containing $NF_3$, $O_2$, $H_2$, and optionally Ar, and exposing the structure to the plasma-excited second process gas. The two step process may be repeated at least once. According to one embodiment, the first process gas may consist of $H_2$.

According to one embodiment, the first process gas may consist of $H_2$ and Ar. According to other embodiments, the second process gas may consist of i) $NF_3$, $O_2$, $H_2$, and Ar; ii) $NF_3$, $O_2$, and $H_2$, iii) $NF_3$ and $O_2$, iv) $NF_3$, $O_2$, and Ar, v) $NF_3$ and $H_2$, or vi) $NF_3$, $H_2$, and Ar. The resulting structure in FIG. 2B contains SiN sidewall spacers 107 and does not have the disadvantages of corner rounding and footing described above in FIG. 1B.

FIG. 2C shows a structure following further plasma etching that selectively removes the Si raised features 102 from the substrate. According to an embodiment of the invention, the further plasma etching includes a two-step etch process that includes plasma exciting a third process gas containing $H_2$ and optionally Ar gas, and exposing the structure in FIG. 2B to the plasma-excited third process gas, and thereafter, plasma-exciting a fourth process gas containing $NF_3$, $O_2$, $H_2$, and optionally Ar, and exposing the structure to the plasma-excited fourth process gas. The two step process may be repeated one or more times to completely remove the Si raised features 102. According to one embodiment, the third process gas may consist of $H_2$. According to one embodiment, the third process gas may consist of $H_2$ and Ar. According to other embodiments, the fourth process gas may consist of i) $NF_3$, $O_2$, $H_2$, and Ar; ii) $NF_3$, $O_2$, and $H_2$, iii) $NF_3$ and $O_2$, iv) $NF_3$, $O_2$, and Ar, v) $NF_3$ and $H_2$, or vi) $NF_3$, $H_2$, and Ar. The resulting structure in FIG. 2C contains SiN sidewall spacers 107 on the $SiO_2$ layer 101 and it does not have the disadvantages described above in FIG. 1C. The step of removing the Si raised features 102 generally has a faster etch rate than the spacer etch step that forms SiN sidewall spacers 107. Furthermore, the step of removing the Si raised features 102 may be optimized to be selective to the SiN sidewall spacers 107. This reduces erosion of the SiN sidewall spacers 107. Further processing can include transferring the pattern formed by the SiN sidewall spacers 107 into the $SiO_2$ layer 101.

According to embodiments of the invention, the processing conditions in the first step can include a chamber pressure of 20-100 mTorr, lower electrode power of 75-200 W at 13.56 MHz, a chamber pressure of 90-400 mTorr, upper electrode power of 200-1000 W at 60 MHz. In some examples, the two-step process may be repeated 2-10 times.

Figure 3A:
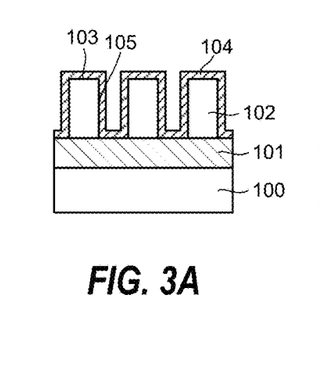
FIGS. 3A-3C schematically show through cross-sectional views a method of processing a substrate.
Figure 3B:
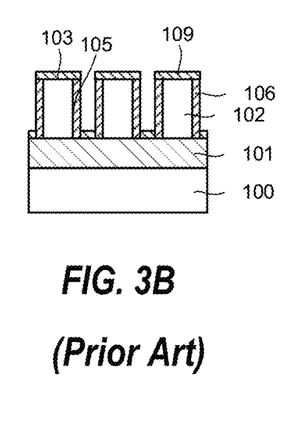
Figure 3C:
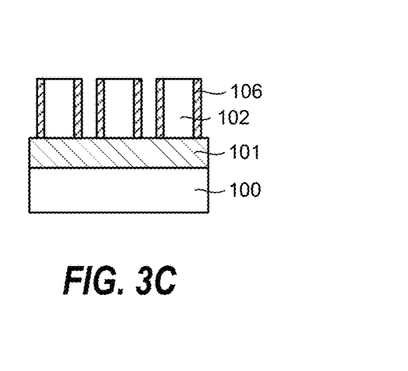

FIGS. 3A-3C schematically show through cross-sectional views a method of processing a substrate. FIG. 1A has been reproduced as FIG. 3A and shows a substrate 100, a $SiO_2$ layer 101, Si raised features 102, and a SiN spacer layer 104 conformally formed on horizontal portions 103 and vertical portions 105 of the Si raised features 102. FIG. 3B shows a structure following an anisotropic plasma exposure that modifies the SiN spacer layer 104 on the horizontal portions 103 and on the $SiO_2$ layer 101. The plasma exposure may use a $H_2$-containing process gas. The modified SiN spacer layer 109 on the horizontal portions 103 and on the $SiO_2$ layer 101, and the Si raised features 102 may subsequently be removed using a wet etching process. FIG. 3C shows the structure following the wet etching process. However, the wet etching process is incompatible with many semiconductor manufacturing processes. Furthermore, dry and wet processing methods require multiple processing chambers and can be incompatible with advanced device manufacturing. Embodiments of the invention address this problem.

Figure 4A:
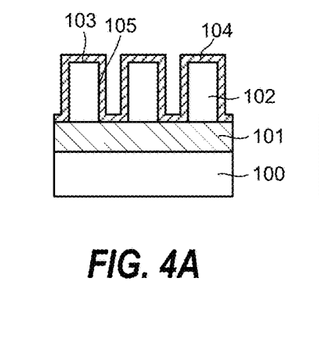
FIGS. 4A-4C schematically show through cross-sectional views a method of processing a substrate according to an embodiment of the invention.
Figure 4B:
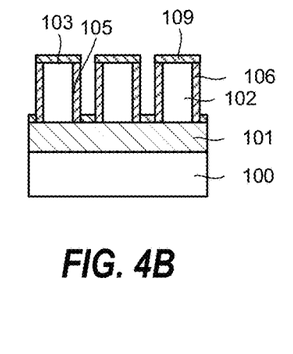
Figure 4C:
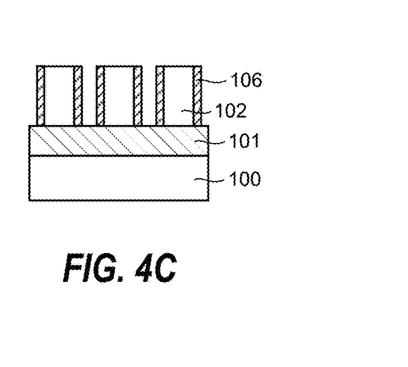

FIGS. 4A-4C schematically show through cross-sectional views a method of processing a substrate according to an embodiment of the invention. FIG. 3A has been reproduced as FIG. 4A and shows a substrate 100, a $SiO_2$ layer 101, Si raised features 102, and a SiN spacer layer 104 conformally formed on horizontal portions 103 and vertical portions 105 of the Si raised features 102.

FIG. 4B shows a structure following a plasma exposure that modifies the SiN spacer layer 104 on the horizontal portions 103 and on the silicon dioxide layer 101. The plasma exposure may use a $H_2$-containing first process gas. According to one embodiment, the process gas may consist of $H_2$. According to one embodiment, the first process gas may consist of $H_2$ and Ar The modified SiN spacer layer 109 on the horizontal portions 103 and on the $SiO_2$ layer 101, and the Si raised features 102, may subsequently be removed using a dry etching process. FIG. 4C shows a structure following further plasma etching. According to an embodiment of the invention, the further plasma etching includes a two-step etch process that includes plasma exciting a second process gas containing $H_2$ and optionally Ar gas, and exposing the structure in FIG. 4B to the plasma-excited second process gas, and thereafter, plasma-exciting a third process gas containing $NF_3$, $O_2$, $H_2$, and optionally Ar, and exposing the structure to the plasma-excited third process gas. The two step process may be repeated one or more times. According to one embodiment, the second process gas may consist of $H_2$. According to one embodiment, the second process gas may consist of $H_2$ and Ar. According to other embodiments, the third process gas may consist of i) $NF_3$, $O_2$, $H_2$, and Ar; ii) $NF_3$, $O_2$, and $H_2$, iii) $NF_3$ and $O_2$, iv) $NF_3$, $O_2$, and Ar, v) $NF_3$ and $H_2$, or vi) $NF_3$, $H_2$, and Ar. The resulting structure in FIG. 4C which contains SiN sidewall spacers 106 and it does not have the problems described above in FIG. 3C.

Figure 5A:
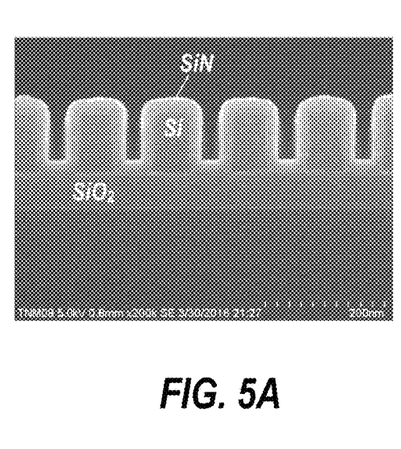
FIGS. 5A and 5B show experimental results for a spacer etching according to an embodiment of the invention.
Figure 5B:
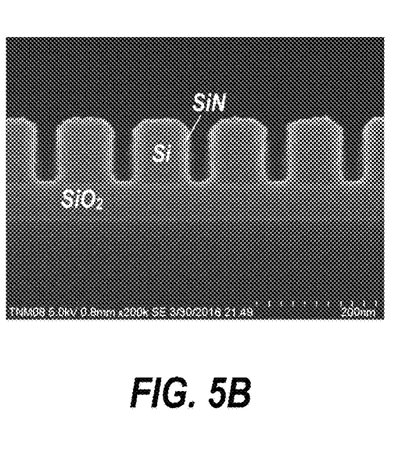

FIGS. 5A and 5B show experimental results for a spacer etching according to an embodiment of the invention. Cross-sectional scanning electron microscopy (SEM) graph in FIG. 5A shows the as-received sample containing a conformal Si spacer layer on Si raised features overlaying a $SiO_2$ layer. The spacer etching was performed in a capacitively coupled plasma (CCP) system and included a two-step process that was repeated once. The processing in the first step included the use of process gas consisting or $H_2$ and Ar, and the processing in the second step included a process gas containing $NF_3$ and $O_2$. The partially formed SiN sidewall spacers are shown in FIG. 5B.

Figure 6:
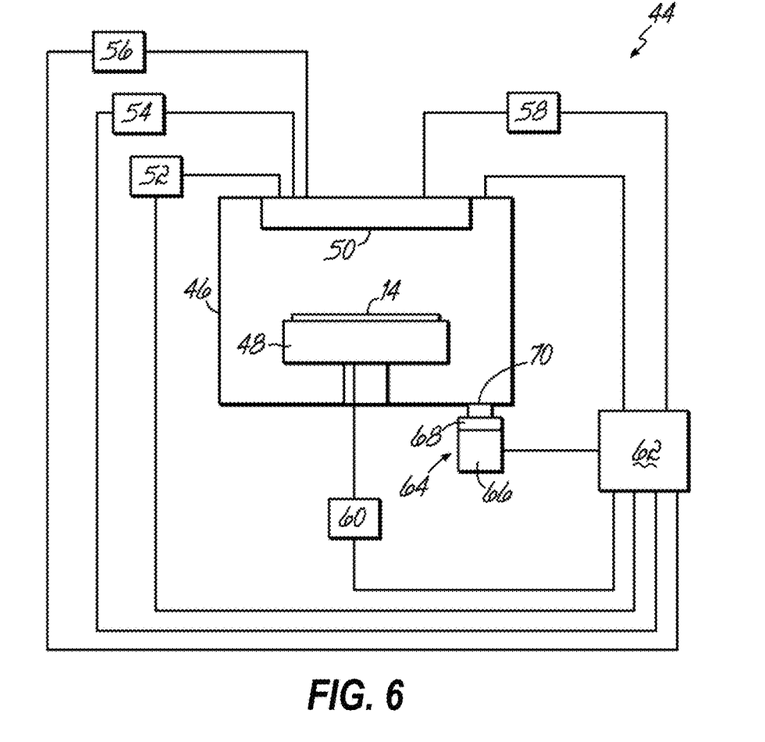
FIG. 6 schematically shows an atomic layer deposition (ALD) system according to an embodiment of the invention.

Referring now to FIG. 6 and FIG. 2A, a technique of conformally depositing the SiN spacer layer 104 may include a monolayer deposition ("MLD") method. The MLD method may include, for example, an ALD method, which is based on the principle of the formation of a saturated monolayer of reactive precursor molecules by chemisorption. A typical MLD process for forming an AB film, for example, consists of injecting a first precursor or reactant A ("RA") for a period of time in which a saturated monolayer of A is formed on the substrate. Then, RA is purged from the chamber using an inert gas, Gi. A second precursor or reactant B ("RB") is then injected into the chamber, also for a period of time, to combine B with A and form the layer AB on the substrate. RB is then purged from the chamber. This process of introducing precursors or reactants, purging the reactor, introducing another or the same precursors or reactants, and purging the reactor may be repeated a number of times to achieve an AB film of a desired thickness. The thickness of an AB film deposited in each ALD cycle may range from about 0.5 angstrom to about 2.5 angstrom.

In some embodiments, the MLD process when forming an AB film may include injecting a precursor containing ABC, which is adsorbed on the substrate during the first step, and then removing C during the second step.

In accordance with one embodiment of the invention, the SiN spacer layer 104 may be deposited by an ALD deposition process in an ALD system, one example of which is shown as ALD system 44 in FIG. 6, which includes a processing chamber 46 having a substrate holder 48 configured to support the substrate 14 thereon. The processing chamber 46 further contains an upper assembly 50 (for example, a shower head) coupled to a first material supply system 52 (which may include a silicon-containing gas), a second material supply system 54 (which may include a nitrogen-containing gas), a purge gas supply system 56, and one or more auxiliary gas supply systems 58 (which may include a dilution gas, or other as necessary for depositing the desired spacer layer material).

Alternatively, or in addition, a controller 62 may be coupled to one or more additional controllers/computers (not shown), which may obtain setup and/or configuration information from the additional controllers/computers. The controller 62 may be used to configure any number of the processing elements 52, 54, 56, 58, 60, and may collect, provide, process, store, and/or display data from the same. The controller 62 may comprise a number of applications for controlling one or more of the processing elements 52, 54, 56, 58, 60, and may, if desired, include a graphical user interface ("GUI," not shown) that may provide an easy to use interface for a user to monitor and/or control one or more of the processing elements 52, 54, 56, 58, 60.

The processing chamber 46 is further coupled to a pressure control system 64, including a vacuum pumping system 66 and a valve 68, through a duct 70, wherein the pressure control system 64 is configured to controllably evacuate the processing chamber 46 to a pressure suitable for forming the SiN spacer layer 104 and suitable for use of the first and second process materials. The vacuum pumping system 66 may include a turbo-molecular vacuum pump ("TMP") or a cryogenic pump that is capable of a pumping speed up to about 5000 liters per second (and greater) and the valve 68 may include a gate valve for throttling the chamber pressure. Moreover, a device (not shown) for monitoring the chamber process may be coupled to the processing chamber 46. The pressure control system 64 may, for example, be configured to control the processing chamber pressure between about 0.1 Torr and about 100 Torr during an ALD process.

The first and second material supply systems 52, 54, the purge gas supply system 56, and each of the one or more auxiliary gas supply systems 58 may include one or more pressure control devices, one or more flow control devices, one or more filters, one or more valves, and/or one or more flow sensors. The flow control devices may include pneumatic driven valves, electro-mechanical (solenoidal) valves, and/or high-rate pulsed gas injection valves. According to embodiments of the invention, gases may be sequentially and alternately pulsed into the processing chamber 46, where the length of each gas pulse may, for example, be between about 0.1 second and about 100 seconds. Alternately, the length of each gas pulse may be between about 1 second and about 10 seconds. Exemplary gas pulse lengths for silicon- and nitrogen-containing gases may be between about 0.3 second and about 3 seconds, for example, about 1 second. Exemplary purge gas pulses may be between about 1 second and about 20 seconds, for example, about 3 seconds. Still referring to FIG. 6, the controller 62 may comprise a microprocessor, memory, and a digital I/O port capable of generating control voltages sufficient to communicate and activate inputs to the ALD system 44, as well as monitor outputs from the ALD system 44. Moreover, the controller 62 may be coupled to and may exchange information with the processing chamber 46, the substrate holder 48, the upper assembly 50, the processing elements 52, 54, 56, 58, the substrate temperature control system 60, and the pressure control system 64. For example, a program stored in a memory of the controller 62 may be utilized to activate the inputs to the aforementioned components of the ALD system 44 according to a process recipe in order to perform a deposition process.

The controller 62 may be implemented as a general purpose computer system that performs a portion or all of the microprocessor-based processing steps of the present invention in response to a processor executing one or more sequences of one or more instructions contained in a memory. Such instructions may be read into the controller memory from another computer readable medium, such as a hard disk or a removable media drive. One or more processors in a multi-processing arrangement may also be employed as the controller microprocessor to execute the sequences of instructions contained in main memory. In alternative embodiments, hard-wired circuitry may be used in place of or in combination with software instructions. Thus, embodiments are not limited to any specific combination of hardware circuitry and software.

The controller 62 includes at least one computer readable medium or memory, such as the controller memory, for holding instructions programmed according to the teachings of the invention and for containing data structures, tables, records, or other data that may be necessary to implement the present invention. Examples of computer readable media are hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave (described below), or any other medium from which a computer can read.

Stored on any one or on a combination of computer readable media, resides software for controlling the controller 62, for driving a device or devices for implementing the present invention, and/or for enabling the controller 62 to interact with a human user. Such software may include, but is not limited to, device drivers, operating systems, development tools, and applications software. Such computer readable media further includes the computer program product of the present invention for performing all or a portion (if processing is distributed) of the processing performed in implementing the present invention.

The computer code devices may be any interpretable or executable code mechanism, including but not limited to scripts, interpretable programs, dynamic link libraries ("DLLs"), Java classes, and complete executable programs. Moreover, parts of the processing of the present invention may be distributed for better performance, reliability, and/or cost.

The term "computer readable medium" as used herein refers to any medium that participates in providing instructions to the processor of the controller 62 for execution. Thus, computer readable medium may take many forms, including but not limited to, non-volatile media, volatile media, and transmission media. Non-volatile media includes, for example, optical, magnetic disks, and magneto-optical disks, such as the hard disk or the removable media drive. Volatile media includes dynamic memory, such as the main memory. Moreover, various forms of computer readable media may be involved in carrying out one or more sequences of one or more instructions to the processor of the controller 62 for execution. For example, the instructions may initially be carried on a magnetic disk of a remote computer. The remote computer can load the instructions for implementing all or a portion of the present invention remotely into a dynamic memory and send the instructions over a network to the controller 62.

The controller 62 may be locally located relative to the ALD system 44, or it may be remotely located relative to the ALD system 44. For example, the controller 62 may exchange data with the ALD system 44 using at least one of a direct connection, an intranet, the Internet and a wireless connection. The controller 62 may be coupled to an intranet at, for example, a customer site (i.e., a device maker, etc.), or it may be coupled to an intranet at, for example, a vendor site (i.e., an equipment manufacturer). Additionally, for example, the controller 62 may be coupled to the Internet. Furthermore, another computer (i.e., controller, server, etc.) may access, for example, the controller 62 to exchange data via at least one of a direct connection, an intranet, and the Internet. As also would be appreciated by those skilled in the art, the controller 62 may exchange data with the ALD system 44 via a wireless connection.

Deposition of the SiN spacer layer 104 may proceed by sequential and alternating pulse sequences to deposit the different components (here, for example, silicon and nitrogen) of the SiN spacer layer 104 material. Since ALD processes typically deposit less than a monolayer of the component per gas pulse, it is possible to form a homogenous material using separate deposition sequences of the different components of the film. Each gas pulse may include a respective purge or evacuation step to remove unreacted gas or byproducts from the processing chamber 46. According to other embodiments of the present invention, one or more of the purge or evacuation steps may be omitted.

Therefore, and as one exemplary embodiment, the substrate 14 with the Si raised features 102 is disposed in the processing chamber 46 of the ALD system 44 and sequentially exposed to a gas pulse containing silicon and a gas pulse of a nitrogen-containing gas, the latter of which may include $NH_3$, plasma-exited nitrogen (such as for use in PEALD systems), or a combination thereof, and optionally an inert gas, such as argon (Ar).

The silicon may react on the surfaces of the Si raised feature 102 to form a chemisorbed layer that is less than a monolayer thick. The nitrogen from the gas pulse of the nitrogen-containing gas may then react with the chemisorbed surface layer. By repeating this sequential gas exposure, i.e., by alternating the two exposures a plurality of times, it is possible to achieve layer-by-layer growth of about 1 angstrom (10-10 meter) per cycle until a desired thickness is achieved.

According to embodiments of the invention, the process gas may be plasma excited using a variety of different plasma sources. According to one embodiment, the plasma source can include a CCP source that contains an upper plate electrode, and a lower plate electrode supporting the substrate. Radio frequency (RF) power may be provided to the upper plate electrode, the lower plate electrode, or both the upper plate and the lower plate electrode, using RF generators and impedance networks. A typical frequency for the application of RF power to the upper electrode ranges from 10 MHz to 200 MHz and may be 60 MHz. Additionally, a typical frequency for the application of RF power to the lower electrode ranges from 0.1 MHz to 100 MHz and may be 13.56 MHz. According to one embodiment, forming the plasma-excited process gas includes generating a plasma using a remote plasma source that creates a high radical to ion flux ratio. The remote plasma source may be located outside of the plasma processing chamber and the plasma-excited gas flowed into the plasma processing chamber to process the substrate.

Figure 7:
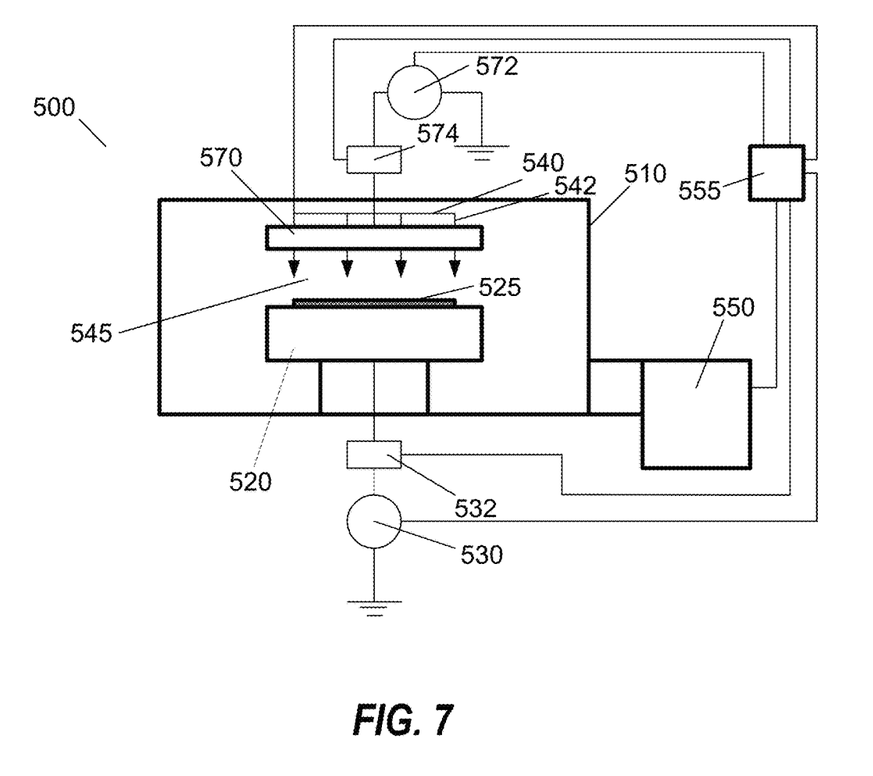
FIG. 7 schematically shows a capacitively coupled plasma (CCP) system according to an embodiment of the invention.

An exemplary plasma processing system 500 depicted in FIG. 7 includes a chamber 510, a substrate holder 520, upon which a substrate 525 to be processed is affixed, a gas injection system 540, and a vacuum pumping system 550. Chamber 510 is configured to facilitate the generation of plasma in a processing region 545 adjacent a surface of substrate 525, wherein plasma is formed via collisions between heated electrons and an ionizable gas. An ionizable gas or mixture of gases is introduced via the gas injection system 540 and the process pressure is adjusted. For example, a gate valve (not shown) is used to throttle the vacuum pumping system 550.

Substrate 525 is transferred into and out of chamber 510 through a slot valve (not shown) and chamber feed-through (not shown) via robotic substrate transfer system where it is received by substrate lift pins (not shown) housed within substrate holder 520 and mechanically translated by devices housed therein. Once the substrate 525 is received from the substrate transfer system, it is lowered to an upper surface of the substrate holder 520.

In an alternate embodiment, the substrate 525 is affixed to the substrate holder 520 via an electrostatic clamp (not shown). Furthermore, the substrate holder 520 further includes a cooling system including a re-circulating coolant flow that receives heat from the substrate holder 520 and transfers heat to a heat exchanger system (not shown), or when heating, transfers heat from the heat exchanger system. Moreover, gas may be delivered to the back-side of the substrate to improve the gas-gap thermal conductance between the substrate 525 and the substrate holder 520. Such a system is utilized when temperature control of the substrate is required at elevated or reduced temperatures. For example, temperature control of the substrate may be useful at temperatures in excess of the steady-state temperature achieved due to a balance of the heat flux delivered to the substrate 525 from the plasma and the heat flux removed from substrate 525 by conduction to the substrate holder 520. In other embodiments, heating elements, such as resistive heating elements, or thermo-electric heaters/coolers are included.

In a first embodiment, the substrate holder 520 further serves as an electrode through which radio frequency (RF) power is coupled to plasma in the processing region 545. For example, the substrate holder 520 is electrically biased at a RF voltage via the transmission of RF power from an RF generator 530 through an impedance match network 532 to the substrate holder 520. The RF bias serves to heat electrons and, thereby, form and maintain plasma. In this configuration, the system operates as a reactive ion etch (ME) reactor, wherein the chamber and upper gas injection electrode serve as ground surfaces. A typical frequency for the RF bias ranges from 0.1 MHz to 100 MHz and may be 13.56 MHz. In an alternate embodiment, RF power is applied to the substrate holder electrode at multiple frequencies. Furthermore, the impedance match network 532 serves to maximize the transfer of RF power to plasma in processing chamber 510 by minimizing the reflected power. Match network topologies (e.g. L-type, π-type, T-type, etc.) and automatic control methods are known in the art.

With continuing reference to FIG. 7, a process gas 542 (e.g., containing $H_2$ and optionally Ar, or $NF_3/O_2/H_2$ and optionally Ar) is introduced to the processing region 545 through the gas injection system 540. Gas injection system 540 can include a showerhead, wherein the process gas 542 is supplied from a gas delivery system (not shown) to the processing region 545 through a gas injection plenum (not shown), a series of baffle plates (not shown) and a multi-orifice showerhead gas injection plate (not shown).

Vacuum pumping system 550 preferably includes a turbo-molecular vacuum pump (TMP) capable of a pumping speed up to 5000 liters per second (and greater) and a gate valve for throttling the chamber pressure. In conventional plasma processing devices utilized for dry plasma etch, a 1000 to 3000 liter per second TMP is employed. TMPs are useful for low pressure processing, typically less than 50 mTorr. At higher pressures, the TMP pumping speed falls off dramatically. For high pressure processing (i.e. greater than 100 mTorr), a mechanical booster pump and dry roughing pump are used.

A computer 555 includes a microprocessor, a memory, and a digital I/O port capable of generating control voltages sufficient to communicate and activate inputs to the plasma processing system 500 as well as monitor outputs from the plasma processing system 500. Moreover, the computer 555 is coupled to and exchanges information with the RF generator 530, the impedance match network 532, the gas injection system 540 and the vacuum pumping system 550. A program stored in the memory is utilized to activate the inputs to the aforementioned components of a plasma processing system 500 according to a stored process recipe.

The plasma processing system 500 further includes an upper plate electrode 570 to which RF power is coupled from an RF generator 572 through an impedance match network 574. A typical frequency for the application of RF power to the upper electrode ranges from 10 MHz to 200 MHz and is preferably 60 MHz. Additionally, a typical frequency for the application of power to the lower electrode ranges from 0.1 MHz to 30 MHz. Moreover, the computer 555 is coupled to the RF generator 572 and the impedance match network 574 in order to control the application of RF power to the upper plate electrode 570.

A method for sidewall image transfer has been disclosed in various embodiments. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A substrate processing method, the method comprising:
providing a substrate containing silicon (Si) raised features;
depositing a conformal film on the Si raised features;
performing a spacer etch process that removes horizontal portions of the conformal film while substantially leaving vertical portions of the conformal film to form sidewall spacers on the Si raised features, the performing including
a) exposing the substrate to a plasma-excited first process gas consisting of $H_2$ gas and optionally an inert gas, and
b) exposing the substrate to a plasma-excited second process gas containing i) $NF_3$, $O_2$, $H_2$, and Ar, ii) $NF_3$, $O_2$, and $H_2$, iii) $NF_3$ and $O_2$, iv) $NF_3$, $O_2$, and Ar, v) $NF_3$ and $H_2$, or vi) $NF_3$, $H_2$, and Ar; and
removing the Si raised features while maintaining the sidewall spacers on the substrate, the removing including
c) exposing the substrate to a plasma-excited third process gas consisting of $H_2$ gas and optionally an inert gas, and
d) exposing the substrate to a plasma-excited fourth process gas consisting of i) $NF_3$, $O_2$, $H_2$, and Ar, ii) $NF_3$, $O_2$, and $H_2$, iii) $NF_3$ and $O_2$, iv) $NF_3$, $O_2$, and Ar, v) $NF_3$ and $H_2$, or vi) $NF_3$, $H_2$, and Ar.

2. The method of claim 1, wherein the first and third process gases consist of $H_2$ and Ar.

3. The method of claim 1, wherein the second and fourth process gases consist of $NF_3$, $O_2$, $H_2$, and Ar.

4. The method of claim 1, wherein the Si raised features consist of elemental Si.

5. The method of claim 4, wherein the elemental Si includes polycrystalline Si (poly-Si) or amorphous Si (a-Si).

6. The method of claim 1, wherein the conformal film includes SiN.

7. The method of claim 1, wherein the plasma-excited process gases are formed using a capacitively coupled plasma source containing an upper plate electrode, and a lower plate electrode supporting the substrate.

8. The method of claim 1, wherein the plasma-excited process gases are formed using a remote plasma source that creates a high radical to ion flux ratio.

9. The method of claim 1, further repeating steps a) and b), and steps c) and d), at least once.

10. A substrate processing method, the method comprising:
   providing a substrate containing Si raised features;
   depositing a conformal film on the Si raised features;
   performing a plasma process that modifies horizontal portions of the conformal film while substantially leaving vertical portions of the conformal film unmodified, the performing including
   a) exposing the substrate to a plasma-excited first process gas consisting of $H_2$ gas and optionally an inert gas, and
   b) exposing the substrate to a plasma-excited second process gas containing i) $NF_3$, $O_2$, $H_2$, and Ar, ii) $NF_3$, $O_2$, and $H_2$, iii) $NF_3$ and $O_2$, iv) $NF_3$, $O_2$, and Ar, v) $NF_3$ and $H_2$, or vi) $NF_3$, $H_2$, and Ar; and
   removing the modified horizontal portions of the conformal film and the Si raised features, the removing including
   c) exposing the substrate to a plasma-excited third process gas consisting of $H_2$ gas and optionally an inert gas, and
   d) exposing the substrate to a plasma-excited fourth process gas consisting of i) $NF_3$, $O_2$, $H_2$, and Ar, ii) $NF_3$, $O_2$, and $H_2$, iii) $NF_3$ and $O_2$, iv) $NF_3$, $O_2$, and Ar, v) $NF_3$ and $H_2$, or vi) $NF_3$, $H_2$, and Ar.

11. The method of claim 10, wherein the first and third process gases consist of $H_2$ and Ar.

12. The method of claim 10, wherein the second and fourth process gases consist of $NF_3$, $O_2$, $H_2$, and Ar.

13. The method of claim 10, wherein the Si raised features include polycrystalline Si (poly-Si) or amorphous Si (a-Si).

14. The method of claim 10, wherein the conformal film includes SiN.

15. The method of claim 10, wherein the plasma-excited process gases are formed using a capacitively coupled plasma source containing an upper plate electrode, and a lower plate electrode supporting the substrate.

16. The method of claim 10, wherein the plasma-excited process gases are formed using a remote plasma source that creates a high radical to ion flux ratio.

17. The method of claim 10, further including repeating steps a) and b), and steps c) and d), at least once.

18. A substrate processing method, the method comprising:
   providing a substrate containing SiN sidewall spacers on Si raised features; and
   removing the Si raised features while maintaining the SiN sidewall spacers on the substrate, the removing including
   exposing the substrate to a first plasma-excited process gas consisting of $H_2$ gas and optionally an inert gas, and
   exposing the substrate to a second plasma-excited process gas consisting of i) $NF_3$, $O_2$, $H_2$, and Ar, ii) $NF_3$, $O_2$, and $H_2$, iii) $NF_3$ and $O_2$, iv) $NF_3$, $O_2$, and Ar, v) $NF_3$ and $H_2$, or vi) $NF_3$, $H_2$, and Ar.

19. The method of claim 18, wherein the first process gas consists of $H_2$ and Ar, and the second process gas consists of $NF_3$, $O_2$, $H_2$, and Ar.

20. The method of claim 19, further including repeating the exposing steps at least once.

* * * * *